(12) United States Patent
Mebarki et al.

(10) Patent No.: US 10,950,448 B2
(45) Date of Patent: Mar. 16, 2021

(54) FILM QUALITY CONTROL IN A LINEAR SCAN PHYSICAL VAPOR DEPOSITION PROCESS

(71) Applicant: APPLIED MATERIALS, INC., Santa Clara, CA (US)

(72) Inventors: Bencherki Mebarki, Santa Clara, CA (US); Joung Joo Lee, San Jose, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/375,941

(22) Filed: Apr. 5, 2019

(65) Prior Publication Data

US 2019/0311905 A1 Oct. 10, 2019

Related U.S. Application Data

(60) Provisional application No. 62/653,984, filed on Apr. 6, 2018.

(51) Int. Cl.
*H01L 21/285* (2006.01)
*H01L 21/67* (2006.01)

(52) U.S. Cl.
CPC .... *H01L 21/2855* (2013.01); *H01L 21/28562* (2013.01); *H01L 21/67253* (2013.01)

(58) Field of Classification Search
None
See application file for complete search history.

(56) References Cited

U.S. PATENT DOCUMENTS

| | | | |
|---|---|---|---|
| 5,256,205 A | 10/1993 | Schmitt, III et al. | |
| 5,356,673 A | 10/1994 | Schmitt et al. | |
| 5,364,664 A | 11/1994 | Tsubouchi et al. | |
| 5,393,699 A | 2/1995 | Mikoshiba et al. | |
| 5,858,471 A | 1/1999 | Ray et al. | |
| 5,871,805 A * | 2/1999 | Lemelson | C23C 14/54 427/10 |
| 6,063,707 A | 5/2000 | Atwater et al. | |
| 6,197,166 B1 | 3/2001 | Moslehi | |
| 7,022,209 B2 | 4/2006 | Sabisch et al. | |
| 2006/0054494 A1* | 3/2006 | Reiss | H01J 37/3447 204/192.12 |
| 2006/0254922 A1 | 11/2006 | Brevnov et al. | |
| 2011/0245074 A1 | 10/2011 | Smith et al. | |

(Continued)

FOREIGN PATENT DOCUMENTS

| | | |
|---|---|---|
| CN | 102184961 | 9/2011 |
| JP | H10223566 | 8/1998 |

*Primary Examiner* — Khaja Ahmad
(74) *Attorney, Agent, or Firm* — Moser Taboada (57) ABSTRACT

Methods and apparatus for control of the quality of films deposited via physical vapor deposition are provided herein. In some embodiments, a method of depositing a film using linear scan physical vapor deposition includes: determining a deposition rate of a material to be deposited on a substrate in a linear scan physical vapor deposition process; calculating a scan rate of the substrate to achieve deposition of the material to a desired thickness in a single pass when deposited at the deposition rate; and performing the linear scan physical vapor deposition process while moving the substrate at the calculated scan rate.

16 Claims, 4 Drawing Sheets

(56) References Cited

U.S. PATENT DOCUMENTS

| | | | |
|---|---|---|---|
| 2013/0292666 A1* | 11/2013 | Sonoda | H01L 27/3276 257/40 |
| 2016/0071708 A1* | 3/2016 | Druz | C23C 14/044 204/298.04 |
| 2016/0181134 A1* | 6/2016 | Budiarto | G03F 1/22 438/7 |

* cited by examiner

FILM QUALITY CONTROL IN A LINEAR SCAN PHYSICAL VAPOR DEPOSITION PROCESS

CROSS-REFERENCE TO RELATED APPLICATIONS

This application claims benefit of U.S. provisional patent application Ser. No. 62/653,984 filed Apr. 6, 2018, which is herein incorporated by reference in its entirety.

FIELD

Embodiments of the present disclosure generally relate to substrate processing equipment and techniques, and more particularly, to methods and apparatus for depositing materials via physical vapor deposition.

BACKGROUND

The inventors have provided methods and apparatus for depositing materials via physical vapor deposition (PVD) of materials at a low angle to the substrate (as compared to about 90 degrees to the surface of the substrate). For example, material to be deposited may be provided in a stream of material flux from a PVD source that is provided at a non-normal angle to the substrate. The substrate is scanned, or moved through the stream of material flux to deposit material on the substrate. The substrate may be scanned once or multiple times to deposit material to a final thickness. The inventors have discovered that control over the deposition process can be advantageously used to control the quality of the film being deposited.

Accordingly, the inventors have provided improved methods depositing materials via physical vapor deposition.

SUMMARY

Methods and apparatus for control of the quality of films deposited via physical vapor deposition are provided herein. In some embodiments, a method of depositing a film using linear scan physical vapor deposition includes: determining a deposition rate of a material to be deposited on a substrate in a linear scan physical vapor deposition process; calculating a scan rate of the substrate to achieve deposition of the material to a desired thickness in a single pass when deposited at the deposition rate; and performing the linear scan physical vapor deposition process while moving the substrate at the calculated scan rate.

In accordance with at least some embodiments, an apparatus for depositing a film using linear scan physical vapor deposition includes: a linear PVD source configured to perform a linear scan physical vapor deposition process and to provide a stream of material flux comprising material to be deposited on a substrate at a determined deposition rate; and a substrate support having a support surface to support a substrate and configured to move relative to the linear PVD source at a calculated scan rate of the substrate to achieve deposition of the material to a desired thickness in a single pass when deposited at the deposition rate.

In accordance with at least some embodiments, a method of depositing a film using linear scan physical vapor deposition includes: determining a deposition rate of a material to be deposited on a substrate in a linear scan physical vapor deposition process, wherein the linear scan physical vapor deposition process has a given set of process parameters that yields the deposition rate; calculating a scan rate of the substrate to achieve deposition of the material to a desired thickness in a single pass when deposited at the deposition rate; and performing the linear scan physical vapor deposition process using the given set of process parameters while moving the substrate at a calculated scan rate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for physical vapor deposition (PVD) are provided herein. Embodiments of the disclosed methods and apparatus advantageously enable uniform angular deposition of materials on a substrate with control over film quality. Examples of film properties which can be controlled include one or more of density, porosity, crystallographic orientation, sheet resistance, or contaminant and/or impurity levels. In some such applications, deposited materials are asymmetric or angular with respect to a given feature on a substrate, but can be relatively uniform within all features across the substrate. In other suitable applications, deposited materials are symmetric with respect to a given feature on a substrate as well as relatively uniform within all features across the substrate. Embodiments of the disclosed methods and apparatus advantageously enable new applications or opportunities for selective PVD of materials, thus further enabling new markets and capabilities.

Figure 1A:
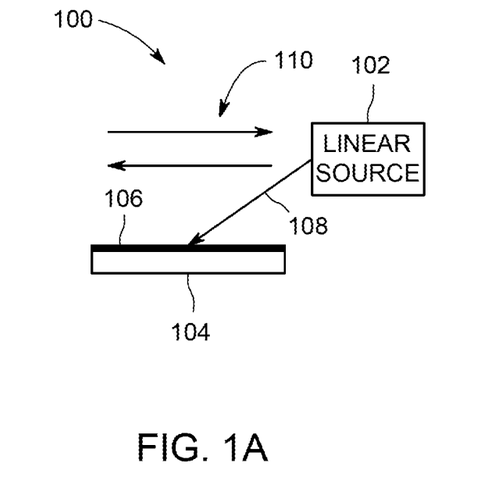
FIGS. 1A-1B are schematic side and top views, respectively, of an apparatus for physical vapor deposition in accordance with at least some embodiments of the present disclosure.
Figure 1B:
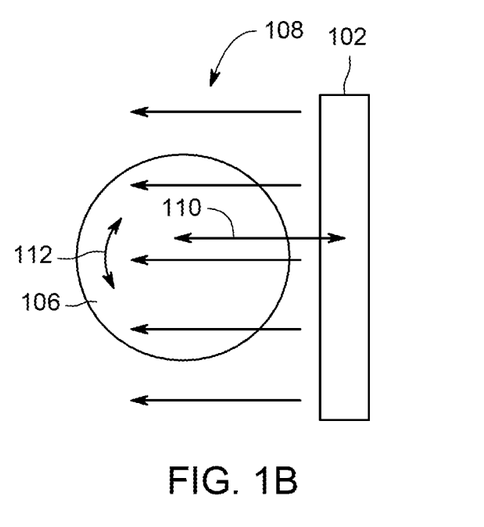
Figure 1C:
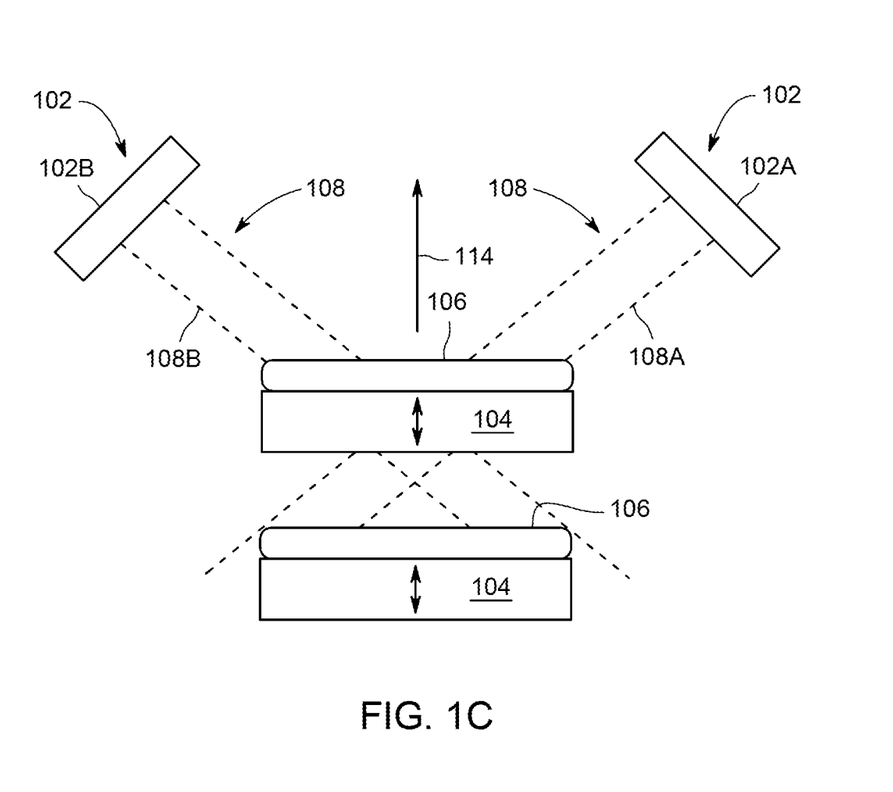
FIG. 1C is a schematic side view of an apparatus for physical vapor deposition in accordance with at least some embodiments of the present disclosure.

The inventive methods disclosed herein may be performed in suitable PVD processing equipment configured for angular deposition of materials on a substrate. FIGS. 1A-1C schematically depict exemplary equipment suitable for use in depositing materials in accordance with the teachings provided herein. FIGS. 1A-1B are schematic side and top views, respectively, of an apparatus 100 for PVD in accordance with at least some embodiments of the present disclosure. FIG. 1C is a schematic side view of another apparatus for physical vapor deposition in accordance with at least some embodiments of the present disclosure.

Specifically, FIGS. 1A-1B schematically depict an apparatus 100 for PVD of materials on a substrate at an angle to the generally planar surface of a substrate 106. The apparatus 100 generally includes a linear PVD source 102 and a substrate support 104 for supporting the substrate 106. The linear PVD source 102 is configured to provide a directed stream of material flux (stream 108 as depicted in FIGS. 1A-1B) toward the substrate support 104 (and any substrate 106 disposed on the substrate support 104). The substrate support 104 has a support surface to support the substrate 106 such that a working surface of the substrate 106 to be deposited on is exposed to the directed stream 108 of material flux. The stream 108 of material flux provided by the linear PVD source 102 has a width greater than that of the substrate support 104 (and any substrate 106 disposed on the substrate support 104), measured at a position corresponding to the support surface or substrate position. The stream 108 of material flux has a linear elongate axis corresponding to the width of the stream 108 of material flux (e.g., the stream 108 is narrower in a dimension perpendicular to the elongate axis in the plane of the support surface or substrate positioned thereon).

Likewise, in FIG. 1C the apparatus 100 can include one or two opposing linear PVD sources 102A and 102B and the substrate support 104 for supporting the substrate 106. The linear PVD sources 102A and 102B are similar to the linear PVD source 102 and are each configured to provide one or more respective directed streams 108A and 108B of material flux toward the substrate support 104 (and any substrate 106 disposed on the substrate support 104). More particularly, the linear PVD sources 102A, 102B may be provided such that the respective streams 108A 108B of material flux are separately directed to impinge of the substrate 106.

In embodiments consistent with FIGS. 1A-B, the substrate support 104 and the linear PVD source 102 are configured to move linearly with respect to each other, as indicated by arrows 110. In embodiments consistent with FIG. 1C, the substrate support 104 and the linear PVD sources 102A and 102B are configured to move linearly with respect to each other along an axis normal to a plane of the support surface of the substrate support 104 (e.g., normal to the plane of a substrate supported on the substrate support 104), as indicated by axis 114.

The relative motion can be accomplished by moving either or both linear PVD source 102 (or the linear PVD sources 102A and 102B) or the substrate support 104. In some embodiments, the linear PVD source 102 is fixed and the substrate support 104 is configured to move. Optionally, the substrate support 104 may additionally be configured to rotate (for example, within the plane of the support surface), as indicated by arrows 112.

The linear PVD source 102 includes target material to be sputter deposited on the substrate 106. In some embodiments, the target material can be, for example, a metal, such as titanium, or the like, suitable for depositing titanium (Ti) or titanium nitride (TiN) on the substrate. In some embodiments, the target material can be, for example, silicon, or a silicon-containing compound, suitable for depositing silicon (Si), silicon nitride (SiN), silicon oxynitride (SiON), or the like on the substrate 106. Other materials may suitably be used as well in accordance with the teachings provided herein. In general, the target material can be any material typically used in thin film fabrication, for example microelectronic device fabrication, via physical vapor deposition. The linear PVD source 102 further includes, or is coupled to, a power source to provide suitable power for forming a plasma proximate the target material and for sputtering atoms off the target material. The power source can be either or both of a DC or an RF power source.

Unlike an ion beam or other ion source, the linear PVD source 102 is configured to provide mostly neutrals and few ions of the target material. As such, a plasma may be formed having a sufficiently low density to avoid ionizing too many of the sputtered atoms of target material. For example, for a 300 mm diameter wafer as the substrate, about 1 to about 20 kW of DC or RF power may be provided. The power or power density applied can be scaled for other size substrates. In addition, other parameters may be controlled to assist in providing mostly neutrals in the stream 108 of material flux. For example, the pressure may be controlled to be sufficiently low so that the mean free path is longer than the general dimensions of an opening of the linear PVD source 102 through which the stream 108 of material flux passes toward the substrate support 104 (as discussed in more detail below). In some embodiments, the pressure may be controlled to be about 0.5 to about 5 millitorr.

Figure 2A:
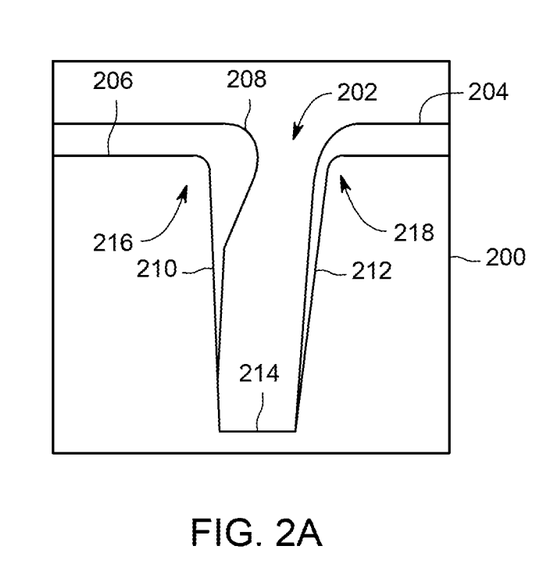
FIG. 2A is a schematic side view of a feature having a layer of material deposited thereon in accordance with at least some embodiments of the present disclosure.

The methods and embodiments disclosed herein advantageously enable deposition of materials with a shaped profile, or in particular, with an asymmetric profile with respect to a given feature on a substrate, while maintaining overall deposition and shape uniformity across all features on a substrate. For example, FIG. 2A depicts a schematic side view of a substrate 200 including a feature 202 having a layer of material 204 deposited thereon in accordance with at least some embodiments of the present disclosure. The feature 202 can be a trench, a via, or dual damascene feature, or the like. In addition, the feature 202 can protrude from the substrate 200 rather than extend into the substrate 200. The material 204 is deposited not just atop a top surface 206 of the substrate 200 (e.g., the field region), but also within or along at least portions of the feature 202 as well. However, the material 204 is deposited to a greater thickness on a first side 210 of the feature as compared to an opposing second side 212 of the feature (as depicted by portion 208 of material). In some embodiments, and depending upon the incoming angle of the stream 108 of material flux, material can be deposited on a bottom 214 of the feature. In some embodiments, and as depicted in FIG. 2A, little or no material is deposited on a bottom 214 of the feature. In some embodiments, additional material is deposited particularly near an upper corner 216 of the first side 210 of the feature 202, as compared to an opposite upper corner 218 of the second side 212 of the feature 202.

Figure 2B:
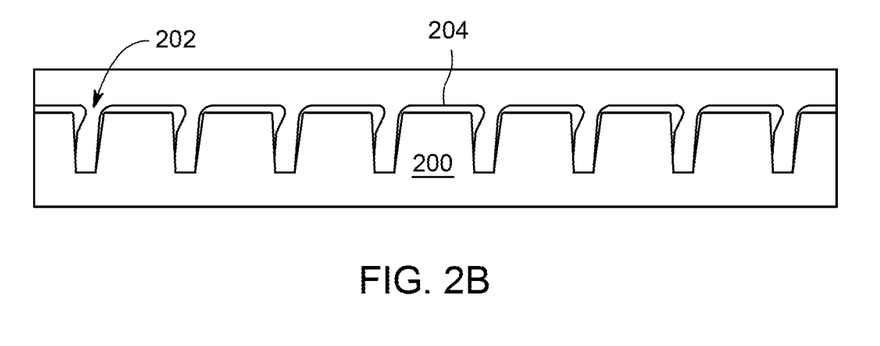
FIG. 2B is a schematic side view of a substrate having a plurality of features having a layer of material deposited thereon, as depicted in FIG. 2A, in accordance with at least some embodiments of the present disclosure.

As shown in FIG. 2B, which is a schematic side view of a substrate having a plurality of features having a layer of material deposited thereon in accordance with at least some embodiments of the present disclosure, the material 204 is deposited relatively uniformly across a plurality of features 202 formed in the substrate 200. As shown in FIG. 2B, the shape of the deposited material 204 is substantially uniform from feature to feature across the substrate 200, but is asymmetric within any given feature 202. Thus, embodiments in accordance with the present disclosure advantageously provide controlled/uniform angular deposition of material on a substrate with a substantially uniform amount of material deposited on a field region of the substrate.

Figure 2C:
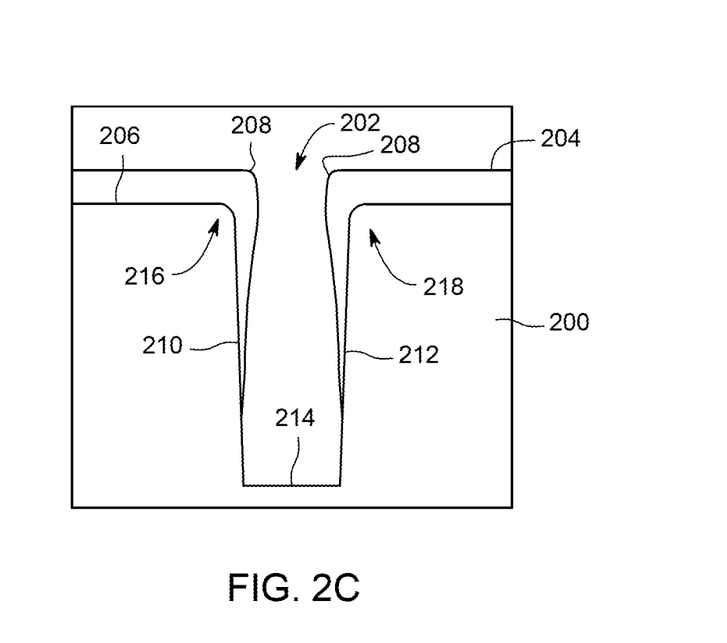
FIG. 2C is a schematic side view of a feature having a layer of material deposited thereon in accordance with at least some embodiments of the present disclosure.

In some embodiments, for example where the substrate support 104 is configured to rotate in addition to moving linearly with respect to the linear PVD source 102, different profiles of material deposition can be provided. For example, FIG. 2C depicts a schematic side view of a substrate 200 including feature 202 having a layer of material 204 deposited thereon in accordance with at least some embodiments of the present disclosure. As described above with respect to FIGS. 2A-2B, the material 204 is deposited not just atop a top surface 206 of the substrate 200 (e.g., the field region), but also within or along at least portions of the feature 202 as well. However, in embodiments consistent with FIG. 2C, the material 204 is deposited to a greater thickness on both the first side 210 of the feature as well as the opposing second side 212 of the feature (as depicted by portion 208 of material) as compared to the bottom 214 of the feature 202. In some embodiments, and depending upon the incoming angle of the stream 108 of material flux, the amount of materials deposited on lower portions of the sidewall and the bottom 214 of the feature can be controlled. However, as depicted in FIG. 2C, little or no material is deposited on the bottom 214 of the feature 202 (as well as on the lower portion of the sidewalls proximate the bottom 214).

Figure 2D:
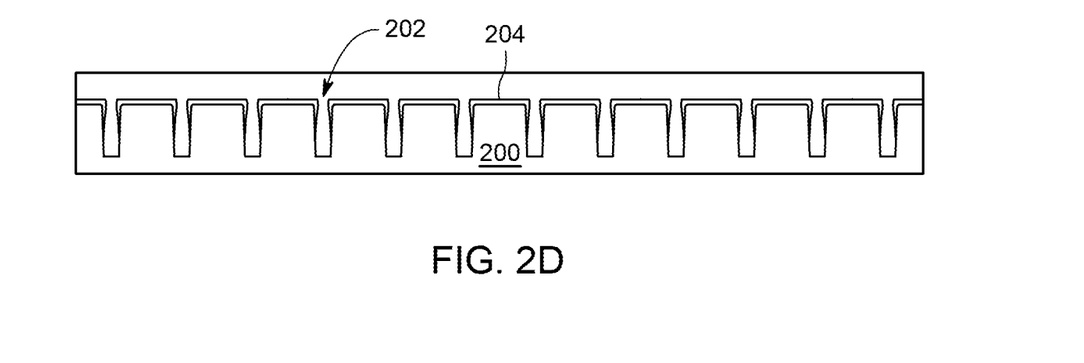
FIG. 2D is a schematic side view of a substrate having a plurality of features having a layer of material deposited thereon, as depicted in FIG. 2C, in accordance with at least some embodiments of the present disclosure.

As shown in FIG. 2D, which is a schematic side view of the substrate 200 having the plurality of features 202 having a layer of material deposited thereon in accordance with at least some embodiments of the present disclosure, the material 204 is deposited relatively uniformly across a plurality of features 202 formed in the substrate 200. As shown in FIG. 2D, the shape of the deposited material 204 is substantially uniform from feature to feature across the substrate 200, but with a controlled material profile within any given feature 202. Thus, embodiments in accordance with the present disclosure advantageously provide controlled/uniform angular deposition of material on a substrate with a substantially uniform amount of material deposited on a field region of the substrate.

Although the above description of FIGS. 2A-2D refer to the feature 202 having sides (e.g., a first side 210 and a second side 212), the feature 202 can be circular (such as a via). In such cases where the feature 202 is circular, although the feature 202 may have a singular sidewall, the first side 210 and second side 212 can be arbitrarily selected/controlled based upon the orientation of the substrate 106 with respect to the linear axis of movement of the substrate support 104 and direction of the stream 108 of material flux from the linear PVD source 102. Moreover, in embodiments where the substrate support 104 can rotate, the first side 210 and second side 212 can change, or be blended, dependent upon the orientation of the substrate 106 during processing. Additionally, although unique deposition patterns are enabled by the presently disclosed methods and apparatus, the methods and apparatus may also be used to deposit layers of material having conventional configurations, such as blanket deposition, or uniform deposition within any features that may be disposed in or formed on the substrate 200.

In operation of a linear scan physical vapor deposition process, the substrate, e.g., the substrate 106 or the substrate 200, is moved linearly through a directed stream (e.g., the stream 108) of material flux to be deposited on the substrate. The movement of the substrate through the directed stream of material flux, from one side to the opposite side, is referred to as a pass. The substrate may be moved through the directed stream of material flux once (a single pass), or many times (multiple passes), to deposit the material on the substrate. In some embodiments, the substrate is moved laterally, from side to side, within a plane of the support surface of the substrate support (and a plane of the working surface of the substrate). In some embodiments, the substrate is moved along an axis normal to the plane of the support surface of the substrate support (and the plane of the working surface of the substrate). In some embodiments, the substrate is also rotated at least one of between scans or during a scan of the substrate through the directed stream of material flux.

The inventors have discovered that the speed at which the scan travels can dramatically impact one or more of several material properties, including, but not limited to: density, porosity, crystallographic orientation, sheet resistance, or contaminant and/or impurity levels. Thus, the scan speed, or velocity, can be controlled to control one or more of the density, porosity, crystallographic orientation, sheet resistance, or contaminant and/or impurity levels, of the resultant deposited material.

Figure 3:
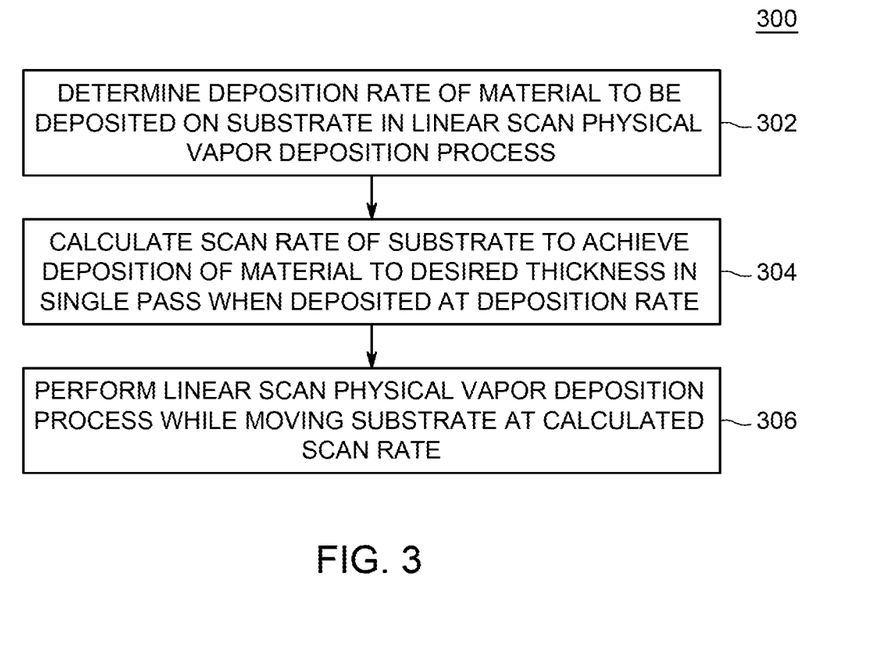
FIG. 3 depicts a flowchart of a method of depositing material on a substrate in a linear scan physical vapor deposition process in accordance with at least some embodiments of the present disclosure.

FIG. 3 depicts a flowchart of a method 300 of depositing material on a substrate (e.g., the substrate 106 or the substrate 200) in a linear scan physical vapor deposition (PVD) process in accordance with at least some embodiments of the present disclosure. The method 300 can be performed in any suitable process chamber configured for linear scan PVD processes, such as but not limited to the apparatus described in FIGS. 1A-1C, above.

The method 300 generally begins at 302, where a deposition rate of a material to be deposited on a substrate in a linear scan PVD process is determined.

The substrate may be any type of substrate suitable for thin film fabrication processes. For example, the substrate may be a semiconductor substrate, a silicon substrate (for example crystalline silicon (e.g., Si<100> or Si<111>), silicon oxide, strained silicon, doped or undoped polysilicon, or the like), a III-V or II-VI compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, or the like. In some embodiments, the substrate may include one or more layers disposed atop, or formed within the substrate.

The substrate is not limited to any particular size or shape. For example, the substrate can be a round wafer having, for example, a diameter of 150 mm, 200 mm, 300 mm, 450 mm, or other diameters. The substrate can also be any polygonal, square, rectangular, curved or otherwise non-circular workpiece, such as a polygonal glass substrate used in the fabrication of flat panel displays, solar cells, or the like.

As noted above, the material to be deposited (e.g., the material of the target in the linear PVD source 102, described above) can generally be any material typically used in thin film fabrication via physical vapor deposition, for example, a metal (such as titanium, or the like, suitable for depositing titanium (Ti) or titanium nitride (TiN) on the substrate), silicon or a silicon-containing compound (suitable for depositing silicon (Si), silicon nitride (SiN), silicon oxynitride (SiON), or the like on the substrate), or other materials.

Typically, there is a limited process window of process parameters that yields acceptable deposition of particular materials. For example, the pressure, substrate temperature, flow rates of process gases, DC or RF power provided to the target, substrate bias levels, and other process parameters are selected to be used in the PVD process. In addition, consideration of the material being deposited and the material or materials being deposited on are considered. For example, material characteristics such as sticking coefficient, interaction of the material being deposited with the underlying material or materials of the substrate, or the like, are factored in to determine acceptable film quality for a given application. Thus, for a given set of process parameters, or for a given window of process parameter values, a resultant deposition rate of the material on the substrate can be determined. The determination can be by empirical observation and measurement, or by computer modelling of the deposition process.

Next, at 304, a scan rate of the substrate is determined to achieve deposition of the material to a desired thickness in a single pass when deposited at the deposition rate. For example, at a particular deposition rate, moving the substrate through the directed stream of material flux at the predetermined scan rate will result in deposition of material on the substrate to the desired thickness. Examples of suitable scan rates include, but are not limited to, up to about 50 mm/sec, or from about 1 mm/sec to about 50 mm/sec.

In some embodiments, the desired thickness is a final thickness of the material deposited on the substrate. In such embodiments, the calculated or determined scan rate is the speed necessary to deposit the material to a final predetermined thickness on the substrate. If the scan rate was slower (or faster), then more (or less) material would be deposited in the pass and the thickness of the deposited material would be more (or less) than the desired thickness.

In some embodiments, the desired thickness is an intermediate thickness of the material deposited on the substrate. For example, the desired thickness can be an intermediate thickness of the material deposited on the substrate, and the linear scan physical vapor deposition process is a first linear scan physical vapor deposition process (e.g., a first pass). A second linear scan physical vapor deposition process (e.g., a second pass) can be performed to deposit additional material atop the material deposited in the first linear scan physical vapor deposition process (e.g., the first pass). The combined thickness of the material deposited in the first pass and the additional material deposited in the second pass can be a final predetermined thickness of material deposited on the substrate. Additional passes can also be performed such that the combined thickness of the materials deposited in the multiple passes equals the final predetermined thickness of material deposited on the substrate.

The inventors have discovered that the scan rate can be used to control certain film properties. For example, lower scan rates generally yield deposited materials having higher density, lower porosity, lower energy (on average) crystallographic orientations, lower sheet resistance, and lower contaminant and/or impurity levels in the resultant deposited film. Similarly, higher scan rates generally yield deposited materials having lower density, higher porosity, higher energy (on average) crystallographic orientations, higher sheet resistance, and higher contaminant and/or impurity levels in the resultant deposited film.

For example, the inventors have observed control over the sheet resistivity of a titanium nitride film deposited on a silicon oxide substrate in a linear scan PVD process by controlling the velocity of the scan. When deposited at scan rates of 50 mm/second, resultant films had a sheet resistance of about 50,000 ohm per square. Depositing the same materials at scan rates of about 10 mm/sec, resultant films had a sheet resistance measured in thousands ohm per square. Depositing the same materials at scan rates of about 1 mm/sec, resultant films had a sheet resistance measured in hundreds ohm per square. Thus, control over the scan rate demonstrated deposition of films with varying sheet resistance over orders of magnitude—from hundreds to tens of thousands ohm per square.

In another example, in traditional PVD process, in which the substrate is static (or only rotating), any atom of material arriving at the substrate surface tries to find the lowest energy position to stick. However, in the linear scan PVD process, in which the substrate is being scanned through the directed stream of material flux, the arriving atoms may not have time to find the lowest energy position. For example, if the scan rate is too fast, the arriving atoms stick wherever they can, which may not be the lowest energy position. Hence, the orientation of the crystal growth, or crystallographic orientation, may be different. Some crystals may be oriented normal to the wafer, while others may be at other orientations, for example, 87 degrees, 80 degrees, or the like, dependent upon orientation angles for the particular materials being deposited.

In another example, the sticking coefficient of the material being deposited and the substrate materials may be a factor in consideration of the scan rate. For example, the scan rate may be different dependent upon depositing titanium on silicon oxide, on titanium nitride, or on polysilicon. Where materials do not stick together that readily, the scan rate may be decreased. Where materials stick together more readily, the scan rate may be increased.

Thus, the desired thickness can be determined based upon consideration of a known thickness of material needed to be deposited on the substrate for a given application, and a desired scan rate to control the film quality (e.g., density, porosity, crystallographic orientation, sheet resistance, or contaminant and/or impurity levels) to meet a known specification for the deposited material. Additional consideration in determining the desired thickness (or scan rate) can be given to the intrinsic properties of the materials being deposited, as well as the material being deposited on (e.g., the substrate), and process parameters such as thermal condition of the substrate, bias power levels (if any), and the like.

Next, at 306, the linear scan physical vapor deposition process is performed while moving the substrate at the determined scan rate. Thus, material is deposited on the substrate to the desired thickness. As noted above, the desired thickness can be a final thickness of material deposited on the substrate (e.g., a single pass process), or an intermediate thickness of material deposited on the substrate (e.g., a multi-pass process). Upon completion of 306, the method generally ends and the substrate can undergo additional processing, as needed for example, to complete fabrication of the structures and/or devices being formed on the substrate. In some embodiments, the method 300 may be repeated using the same or different materials to deposit additional materials on the substrate.

While the foregoing is directed to embodiments of the present disclosure, other and further embodiments of the disclosure may be devised without departing from the basic scope thereof.

The invention claimed is:

1. A method of depositing a film using linear scan physical vapor deposition, comprising:

determining a deposition rate of a material to be deposited on a substrate in a linear scan physical vapor deposition process which includes a given set of process parameters that yields the deposition rate;

calculating a scan rate of the substrate to achieve deposition of the material to a desired thickness in a single pass when deposited at the deposition rate; and performing the linear scan physical vapor deposition process while moving the substrate at the calculated scan rate, wherein the given set of process parameters comprises at least one of pressure, substrate temperature, flow rates of process gases, DC or RF power provided to a target, substrate bias levels, and material characteristics including at least one of a sticking coefficient of the material and an interaction of the material being deposited with an underlying material or materials of the substrate.

2. The method of claim 1, wherein the linear scan physical vapor deposition process is performed using the given set of process parameters while moving the substrate at the calculated scan rate.

3. The method of claim 1, wherein the calculated scan rate is about 1 mm/sec to about 50 mm/sec.

4. The method of claim 1, wherein the material is titanium nitride and the substrate is silicon oxide.

5. A method of depositing a film using linear scan physical vapor deposition, comprising:

determining a deposition rate of a material to be deposited on a substrate in a linear scan physical vapor deposition process;

calculating a scan rate of the substrate to achieve deposition of the material to a desired thickness in a single pass when deposited at the deposition rate; and performing the linear scan physical vapor deposition process while moving the substrate at the calculated scan rate, wherein calculating the scan rate of the substrate is based in part on a sheet resistivity of the material relative to the substrate, and wherein the method further comprises moving the substrate at the calculated scan rate of about 1 mm/second to about 50 mm/second so that a resultant film of the deposited material on the substrate has a sheet resistance of about hundreds ohm per square to about 50,000 ohm per square.

6. The method of claim 1, wherein the desired thickness is a final thickness of the material deposited on the substrate.

7. The method of claim 6, wherein the desired thickness is an intermediate thickness of the material deposited on the substrate, and wherein the linear scan physical vapor deposition process is a first linear scan physical vapor deposition process.

8. The method of claim 7, further comprising:

performing a second linear scan physical vapor deposition process to deposit additional material atop the material deposited in the first linear scan physical vapor deposition process.

9. The method of claim 8, wherein a combined thickness of the material and the additional material is a final predetermined thickness of material deposited on the substrate.

10. An apparatus for depositing a film using linear scan physical vapor deposition, comprising:

a linear PVD source configured to perform a linear scan physical vapor deposition process, which includes a given set of process parameters that yields the deposition rate, and to provide a stream of material flux comprising material to be deposited on a substrate at a determined deposition rate; and a substrate support having a support surface to support the substrate and configured to move relative to the linear PVD source at a calculated scan rate of the substrate to achieve deposition of the material to a desired thickness in a single pass when deposited at the deposition rate, wherein the given set of process parameters comprises at least one of pressure, substrate temperature, flow rates of process gases, DC or RF power provided to a target, substrate bias levels, and material characteristics including at least one of a sticking coefficient of the material and an interaction of the material being deposited with an underlying material or materials of the substrate.

11. The apparatus of claim 10, wherein the calculated scan rate is about 1 mm/sec to about 50 mm/sec.

12. The apparatus of claim 10, wherein the material is titanium nitride and the substrate is silicon oxide.

13. An apparatus for depositing a film using linear scan physical vapor deposition, comprising:

a linear PVD source configured to perform a linear scan physical vapor deposition process and to provide a stream of material flux comprising material to be deposited on a substrate at a determined deposition rate; and a substrate support having a support surface to support the substrate and configured to move relative to the linear PVD source at a calculated scan rate of the substrate to achieve deposition of the material to a desired thickness in a single pass when deposited at the deposition rate, wherein the calculated scan rate of the substrate is calculated based in part on a sheet resistivity of the material relative to the substrate, and wherein the substrate support is configured to move the substrate is moved at a scan rate of about 1 mm/second to about 50 mm/second so that a resultant film of the deposited material on the substrate has a sheet resistance of about hundreds ohm per square to about 50,000 ohm per square.

14. The apparatus of claim 10, wherein the desired thickness is a final thickness of the material deposited on the substrate, wherein the desired thickness is an intermediate thickness of the material deposited on the substrate, and wherein the linear scan physical vapor deposition process is a first linear scan physical vapor deposition process.

15. The apparatus of claim 14, wherein the linear PVD source is further configured to perform a second linear scan physical vapor deposition process to deposit additional material atop the material deposited in the first linear scan physical vapor deposition process, and wherein a combined thickness of the material and the additional material is a final predetermined thickness of material deposited on the substrate.

16. A method of depositing a film using linear scan physical vapor deposition, comprising:

determining a deposition rate of a material to be deposited on a substrate in a linear scan physical vapor deposition process, wherein;

calculating a scan rate of the substrate to achieve deposition of the material to a desired thickness in a single pass when deposited at the deposition rate, wherein the scan rate is calculated using a sticking coefficient of the material to be deposited; and performing the linear scan physical vapor deposition process using a given set of process parameters while moving the substrate at the calculated scan rate.

\* \* \* \* \*